US012162219B2

(12) United States Patent
DeMuth et al.

(10) Patent No.: US 12,162,219 B2
(45) Date of Patent: *Dec. 10, 2024

(54) CHAMBER SYSTEMS FOR ADDITIVE MANUFACTURING

(71) Applicant: Seurat Technologies, Inc., Wilmington, MA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/343,431

(22) Filed: Jun. 28, 2023

(65) Prior Publication Data

US 2023/0356465 A1    Nov. 9, 2023

Related U.S. Application Data

(63) Continuation of application No. 17/193,978, filed on Mar. 5, 2021, now Pat. No. 11,724,455, which is a (Continued)

(51) Int. Cl.
*B29C 64/264* (2017.01)
*B22F 3/24* (2006.01)
(Continued)

(52) U.S. Cl.
CPC .............. *B29C 64/264* (2017.08); *B22F 3/24* (2013.01); *B22F 10/00* (2021.01); *B22F 12/33* (2021.01);
(Continued)

(58) Field of Classification Search
CPC ..... B29C 64/153; B29C 64/264; B22F 12/00; B22F 12/17; B22F 12/20; B22F 12/40; B22F 12/41; B22F 12/44; B33Y 10/00
See application file for complete search history.

(56) References Cited

U.S. PATENT DOCUMENTS 4,401,297 A * 8/1983 Doi .................... B22F 3/003
266/259
5,393,482 A * 2/1995 Benda ................ B29C 64/153
419/61
(Continued)

*Primary Examiner* — Jerzi H Moreno Hernandez
(74) *Attorney, Agent, or Firm* — David R. Stevens; Stevens Law Group

(57) ABSTRACT

An apparatus for additive printing is provided. The apparatus includes a print head, an optical-mechanical assembly, and a rejected energy handling device. The print head includes an energy source and one or more energy patterning devices configured to provide one or more two-dimensional patterned incident beams to process a powdered material. The optical-mechanical assembly includes optical components arranged to receive and direct the one or more incident beams into a location. The rejected energy handling device is configured to reuse beam energy rejected by the one or more energy patterning devices by relaying the rejected beam energy to either or both of an electricity generator and a thermal management system.

19 Claims, 16 Drawing Sheets

Related U.S. Application Data continuation of application No. 15/336,644, filed on Oct. 27, 2016, now Pat. No. 10,967,566.

(60) Provisional application No. 62/248,758, filed on Oct. 30, 2015, provisional application No. 62/248,765, filed on Oct. 30, 2015, provisional application No. 62/248,770, filed on Oct. 30, 2015, provisional application No. 62/248,776, filed on Oct. 30, 2015, provisional application No. 62/248,783, filed on Oct. 30, 2015, provisional application No. 62/248,791, filed on Oct. 30, 2015, provisional application No. 62/248,799, filed on Oct. 30, 2015, provisional application No. 62/248,966, filed on Oct. 30, 2015, provisional application No. 62/248,968, filed on Oct. 30, 2015, provisional application No. 62/248,969, filed on Oct. 30, 2015, provisional application No. 62/248,980, filed on Oct. 30, 2015, provisional application No. 62/248,989, filed on Oct. 30, 2015, provisional application No. 62/248,780, filed on Oct. 30, 2015, provisional application No. 62/248,787, filed on Oct. 30, 2015, provisional application No. 62/248,795, filed on Oct. 30, 2015, provisional application No. 62/248,821, filed on Oct. 30, 2015, provisional application No. 62/248,829, filed on Oct. 30, 2015, provisional application No. 62/248,833, filed on Oct. 30, 2015, provisional application No. 62/248,835, filed on Oct. 30, 2015, provisional application No. 62/248,839, filed on Oct. 30, 2015, provisional application No. 62/248,841, filed on Oct. 30, 2015, provisional application No. 62/248,847, filed on Oct. 30, 2015, provisional application No. 62/248,848, filed on Oct. 30, 2015.

(51) Int. Cl.
| | |
|---|---|
| *B22F 10/00* | (2021.01) |
| *B22F 12/00* | (2021.01) |
| *B22F 12/33* | (2021.01) |
| *B22F 12/44* | (2021.01) |
| *B22F 12/70* | (2021.01) |
| *B23K 15/00* | (2006.01) |
| *B23K 15/06* | (2006.01) |
| *B23K 26/03* | (2006.01) |
| *B23K 26/08* | (2014.01) |
| *B23K 26/12* | (2014.01) |
| *B23K 26/142* | (2014.01) |
| *B23K 26/144* | (2014.01) |
| *B23K 26/16* | (2006.01) |
| *B23K 26/36* | (2014.01) |
| *B23K 26/70* | (2014.01) |
| *B23K 37/04* | (2006.01) |
| *B29C 64/153* | (2017.01) |
| *B29C 64/268* | (2017.01) |
| *B29C 64/386* | (2017.01) |
| *B33Y 10/00* | (2015.01) |
| *B33Y 40/00* | (2020.01) |
| *B33Y 50/02* | (2015.01) |
| *B33Y 70/00* | (2020.01) |
| *B33Y 80/00* | (2015.01) |
| *G02B 7/14* | (2021.01) |
| *G02B 7/16* | (2021.01) |
| *G02B 7/182* | (2021.01) |
| *G02B 15/04* | (2006.01) |
| *G02B 15/10* | (2006.01) |
| *G02B 19/00* | (2006.01) |
| *G02B 26/08* | (2006.01) |
| *G02F 1/01* | (2006.01) |
| *G02F 1/1333* | (2006.01) |
| *G02F 1/135* | (2006.01) |
| *B22F 10/10* | (2021.01) |
| *B22F 10/32* | (2021.01) |
| *B22F 10/47* | (2021.01) |
| *B22F 10/50* | (2021.01) |
| *B22F 10/64* | (2021.01) |
| *B22F 10/73* | (2021.01) |
| *B22F 12/17* | (2021.01) |
| *B22F 12/20* | (2021.01) |
| *B22F 12/41* | (2021.01) |
| *B22F 12/45* | (2021.01) |
| *B22F 12/53* | (2021.01) |
| *B23K 26/00* | (2014.01) |
| *B23K 26/082* | (2014.01) |
| *B23K 26/342* | (2014.01) |
| *B23K 101/00* | (2006.01) |
| *B23K 101/02* | (2006.01) |
| *B23K 101/24* | (2006.01) |
| *B23K 103/00* | (2006.01) |
| *B25J 11/00* | (2006.01) |
| *B28B 1/00* | (2006.01) |
| *B29K 105/00* | (2006.01) |
| *B33Y 30/00* | (2015.01) |
| *B33Y 99/00* | (2015.01) |
| *G02B 27/00* | (2006.01) |
| *G02B 27/09* | (2006.01) |
| *G02B 27/10* | (2006.01) |
| *G02B 27/14* | (2006.01) |
| *G02B 27/28* | (2006.01) |
| *G05B 17/02* | (2006.01) |
| *G07C 3/14* | (2006.01) |
| *H01S 5/40* | (2006.01) |

(52) U.S. Cl.
CPC .............. *B22F 12/38* (2021.01); *B22F 12/44* (2021.01); *B22F 12/70* (2021.01); *B23K 15/0093* (2013.01); *B23K 15/06* (2013.01); *B23K 26/032* (2013.01); *B23K 26/0846* (2013.01); *B23K 26/1224* (2015.10); *B23K 26/123* (2013.01); *B23K 26/127* (2013.01); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B29C 64/153* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *G02B 7/14* (2013.01); *G02B 7/16* (2013.01); *G02B 7/1827* (2013.01); *G02B 15/04* (2013.01); *G02B 15/10* (2013.01); *G02B 19/0028* (2013.01); *G02B 26/0816* (2013.01); *G02F 1/0136* (2013.01); *G02F 1/133362* (2013.01); *G02F 1/135* (2013.01); *B22F 2003/247* (2013.01); *B22F 2003/248* (2013.01); *B22F 10/10* (2021.01); *B22F 10/32* (2021.01); *B22F 10/47* (2021.01); *B22F 10/50* (2021.01); *B22F 10/64* (2021.01); *B22F 10/73* (2021.01); *B22F 12/17* (2021.01); *B22F 12/20*

(2021.01); *B22F 12/222* (2021.01); *B22F 12/41* (2021.01); *B22F 12/45* (2021.01); *B22F 12/53* (2021.01); *B22F 2998/10* (2013.01); *B22F 2999/00* (2013.01); *B23K 15/0006* (2013.01); *B23K 15/0013* (2013.01); *B23K 15/002* (2013.01); *B23K 15/0026* (2013.01); *B23K 15/0086* (2013.01); *B23K 26/0006* (2013.01); *B23K 26/03* (2013.01); *B23K 26/082* (2015.10); *B23K 26/083* (2013.01); *B23K 26/342* (2015.10); *B23K 37/0408* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B25J 11/00* (2013.01); *B28B 1/001* (2013.01); *B29K 2105/251* (2013.01); *B33Y 30/00* (2014.12); *B33Y 99/00* (2014.12); *G02B 19/0047* (2013.01); *G02B 27/0068* (2013.01); *G02B 27/0905* (2013.01); *G02B 27/108* (2013.01); *G02B 27/141* (2013.01); *G02B 27/283* (2013.01); *G02B 27/286* (2013.01); *G05B 17/02* (2013.01); *G05B 2219/49023* (2013.01); *G07C 3/146* (2013.01); *H01S 5/4012* (2013.01); *Y02P 10/25* (2015.11); *Y02P 80/40* (2015.11)

(56) References Cited

U.S. PATENT DOCUMENTS

| | | | | |
|---|---|---|---|---|
| 11,292,090 | B2* | 4/2022 | DeMuth | B33Y 40/00 |
| 11,724,455 | B2* | 8/2023 | DeMuth | B29C 64/153 |
| | | | | 425/162 |
| 2001/0024268 | A1* | 9/2001 | Fielding | G02B 26/0833 |
| | | | | 353/31 |
| 2003/0222066 | A1* | 12/2003 | Low | B29C 64/153 |
| | | | | 219/121.83 |
| 2005/0133527 | A1* | 6/2005 | Dullea | B29C 45/7312 |
| | | | | 222/1 |
| 2006/0227294 | A1* | 10/2006 | Lerner | G02B 5/04 |
| | | | | 353/33 |
| 2007/0077323 | A1* | 4/2007 | Stonesmith | B29C 64/182 |
| | | | | 425/174 |
| 2010/0233012 | A1* | 9/2010 | Higashi | B22F 12/00 |
| | | | | 419/9 |
| 2011/0252618 | A1* | 10/2011 | Diekmann | B29C 64/153 |
| | | | | 29/401.1 |
| 2013/0101746 | A1* | 4/2013 | Keremes | B29C 64/153 |
| | | | | 427/457 |
| 2013/0193620 | A1* | 8/2013 | Mironets | B22F 10/28 |
| | | | | 264/401 |
| 2013/0200050 | A1* | 8/2013 | Ehrmann | B23K 26/361 |
| | | | | 219/121.69 |
| 2018/0079033 | A1* | 3/2018 | Krueger | B29C 64/153 |

* cited by examiner

CHAMBER SYSTEMS FOR ADDITIVE MANUFACTURING

CROSS-REFERENCE TO RELATED PATENT APPLICATION

The present disclosure is a continuation of U.S. patent application Ser. No. 17/193,978, filed Mar. 5, 2021, which is a continuation of U.S. patent application Ser. No. 15/336,644, filed on Oct. 27, 2016.

U.S. patent application Ser. No. 15/336,644 is also part of a non-provisional patent application claiming the priority benefit of
- U.S. Patent Application No. 62/248,758, filed on Oct. 30, 2015,
- U.S. Patent Application No. 62/248,765, filed on Oct. 30, 2015,
- U.S. Patent Application No. 62/248,770, filed on Oct. 30, 2015,
- U.S. Patent Application No. 62/248,776, filed on Oct. 30, 2015,
- U.S. Patent Application No. 62/248,783, filed on Oct. 30, 2015,
- U.S. Patent Application No. 62/248,791, filed on Oct. 30, 2015,
- U.S. Patent Application No. 62/248,799, filed on Oct. 30, 2015,
- U.S. Patent Application No. 62/248,966, filed on Oct. 30, 2015,
- U.S. Patent Application No. 62/248,968, filed on Oct. 30, 2015,
- U.S. Patent Application No. 62/248,969, filed on Oct. 30, 2015,
- U.S. Patent Application No. 62/248,980, filed on Oct. 30, 2015,
- U.S. Patent Application No. 62/248,989, filed on Oct. 30, 2015,
- U.S. Patent Application No. 62/248,780, filed on Oct. 30, 2015,
- U.S. Patent Application No. 62/248,787, filed on Oct. 30, 2015,
- U.S. Patent Application No. 62/248,795, filed on Oct. 30, 2015,
- U.S. Patent Application No. 62/248,821, filed on Oct. 30, 2015,
- U.S. Patent Application No. 62/248,829, filed on Oct. 30, 2015,
- U.S. Patent Application No. 62/248,833, filed on Oct. 30, 2015,
- U.S. Patent Application No. 62/248,835, filed on Oct. 30, 2015,
- U.S. Patent Application No. 62/248,839, filed on Oct. 30, 2015,
- U.S. Patent Application No. 62/248,841, filed on Oct. 30, 2015,
- U.S. Patent Application No. 62/248,847, filed on Oct. 30, 2015, and
- U.S. Patent Application No. 62/248,848, filed on Oct. 30, 2015, which are incorporated by reference in their entirety.

TECHNICAL FIELD

The present disclosure generally relates to additive manufacturing and, more particularly, to powder bed fusion additive manufacturing chamber designs with high throughput capabilities.

BACKGROUND

Additive manufacturing, commonly known as 3D printing, are widely used to lower cost and risk in manufacturing of prototypes. In particular, powder bed fusion additive manufacturing reduces the amount of raw material used and places a lower burden on the resources and the environment. As more industrial sectors adopt additive manufacturing for product innovation or mass-production tools, limitations of efficiency and throughput remain challenging to overcome. Contemporary powder bed fusion additive manufacturing systems may be operated in a batch-mode style to print an object in a build chamber. Once a print job is completed, interruptions of operations are required for removing the printed object and remaining powders in the build chamber, with a possibility of switching to a different powdered material. Moreover, the intensity of the light source and optical components may need to be adjusted, re-aligned, or re-configured for the new powdered material. This de-powering and activities of re-arrangements consumes a large fraction of overall machine available time, thereby adversely impacting utilization, efficiency, and ultimately the economics of additive manufacturing.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1A:
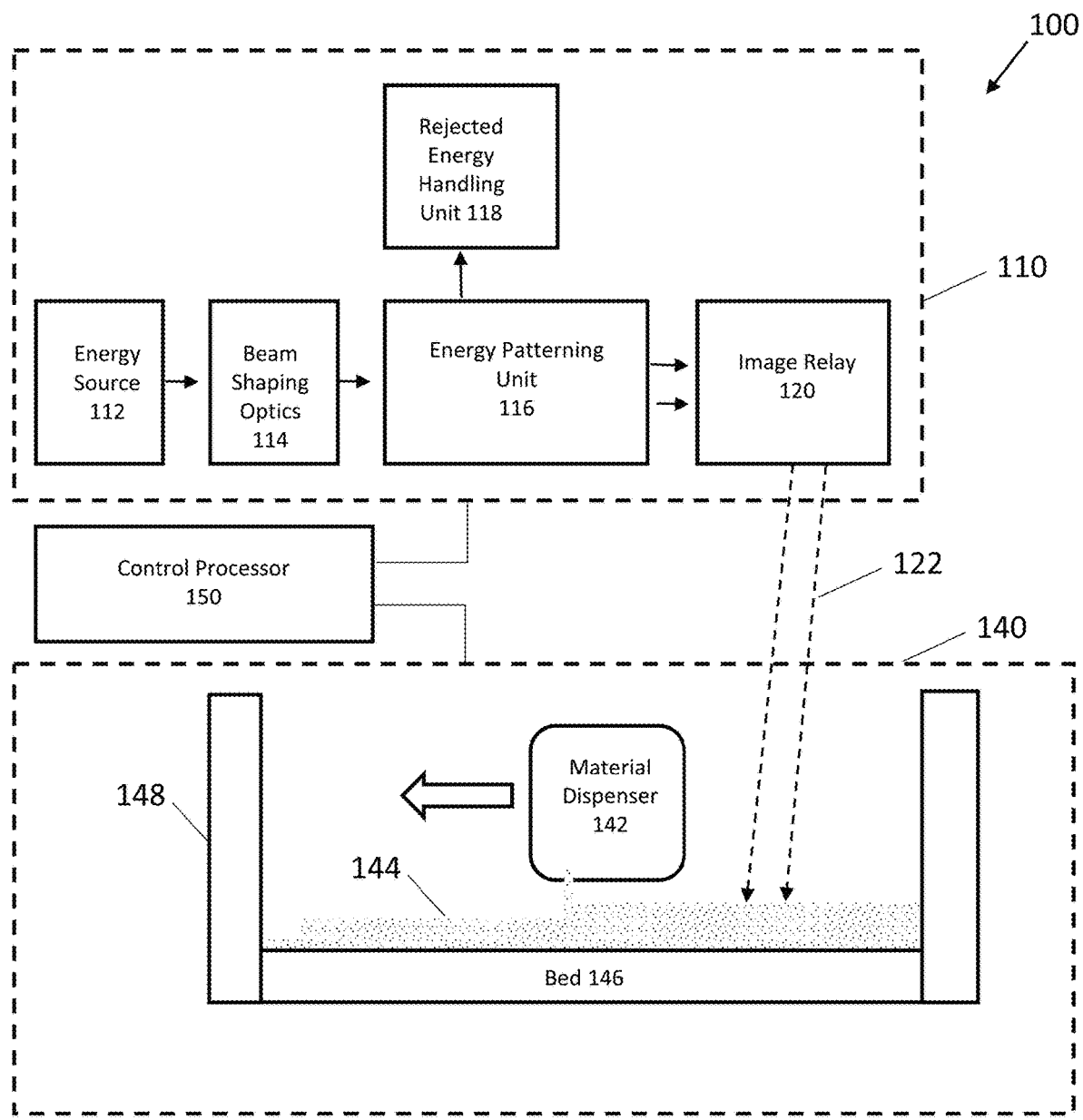
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure describes a powder bed fusion additive manufacturing system configured with multiple build chambers to enhance efficiency and throughput rates. The build chambers also include a side removal mechanism for handling large and heavy printed objects. Moreover, elevated temperature controls and post processing heat treatments are feasible inside the build chambers.

In various embodiments in accordance with the present disclosure, a powder bed fusion additive manufacturing system configured with multiple build chambers may allow concurrent printing of one or more objects inside different build chambers. The multiple-chamber approach may reduce overhead associated with switching powdered materials inside a build chamber for printing different objects. The build chambers may be equipped with a side removal mechanism that improves handling and efficiency for printing large and heavy objects. Heating/cooling elements and temperature sensors may be embedded inside the build chamber to control process temperatures during concurrent printing or post processing heat treatments.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/$MnCl_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate(Nd:$YVO_4$) laser, Neodymium doped yttrium calcium oxoborateNd:$YCa_4O(BO_3)^3$ or simply Nd:YCOB, Neodymium glass(Nd:Glass) laser, Titanium sapphire(Ti:sapphire) laser, Thulium YAG (Tm:YAG) laser, Ytterbium YAG (Yb:YAG) laser, Ytterbium:$2O_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride(Ce:LiSAF, Ce:LiCAF), Promethium 147 doped phosphate glass(147$Pm^{+3}$:Glass) solid-state laser, Chromium doped chrysoberyl (alexandrite) laser, Erbium doped anderbium-ytterbium co-doped glass lasers, Trivalent uranium doped calcium fluoride (U:$CaF_2$) solid-state laser, Divalent samarium doped calcium fluoride(Sm:$CaF_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
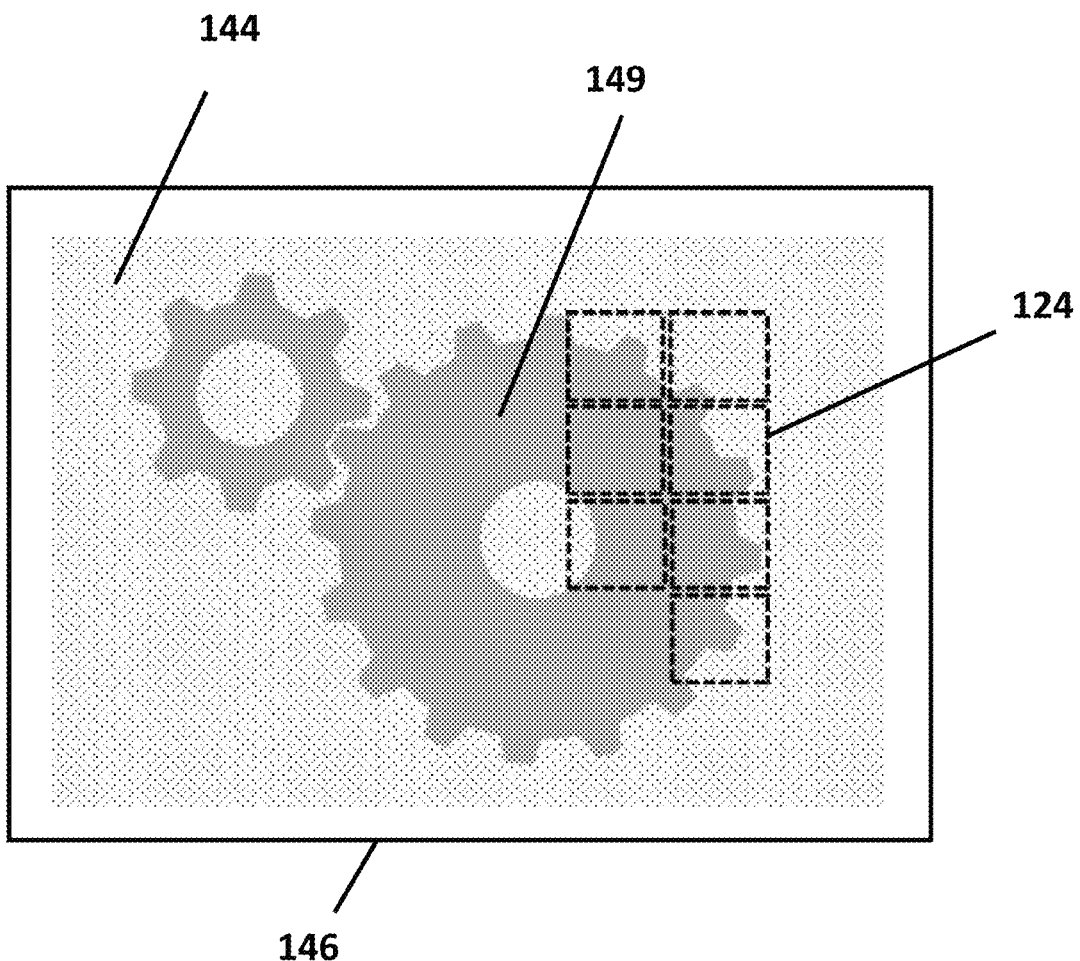
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
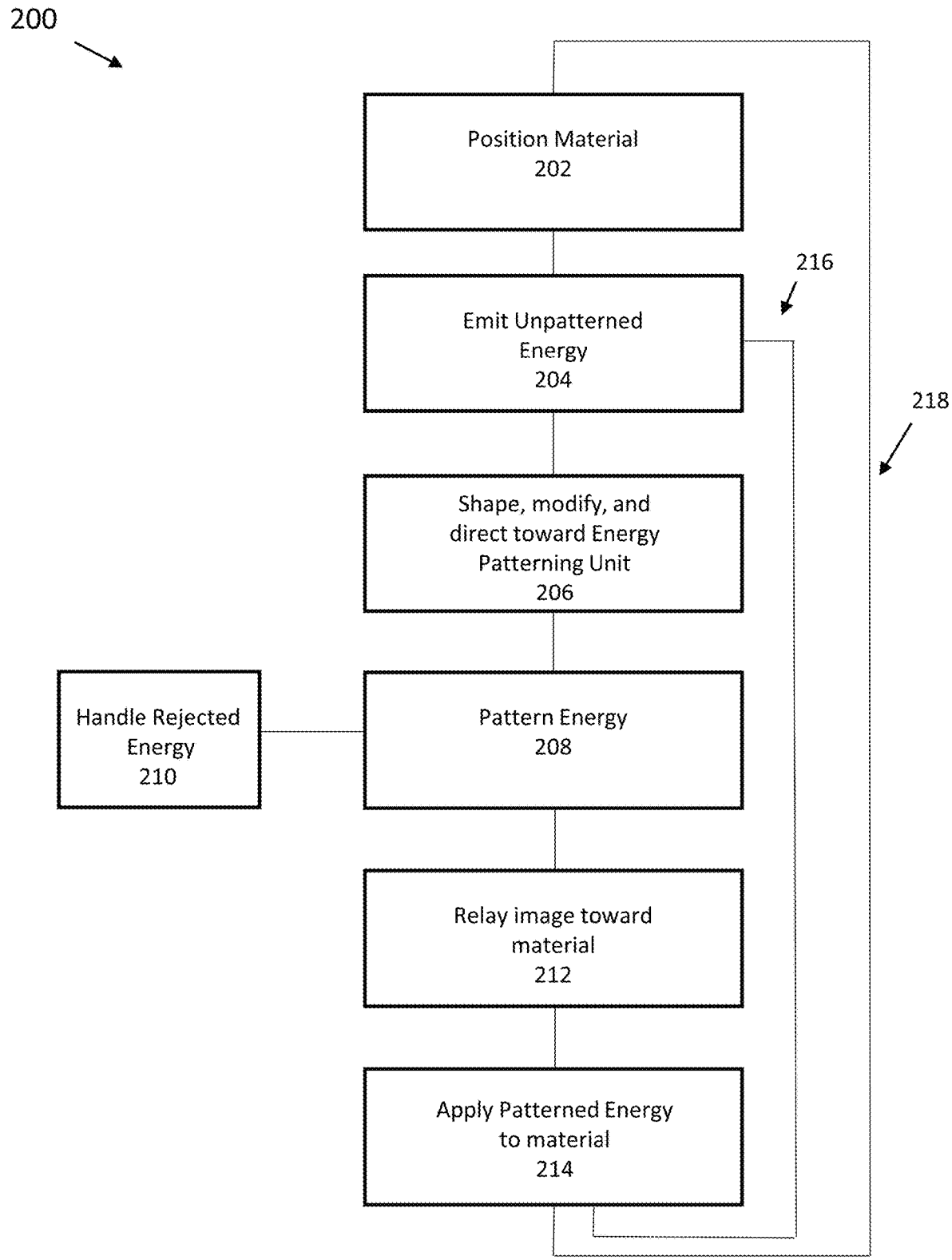
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
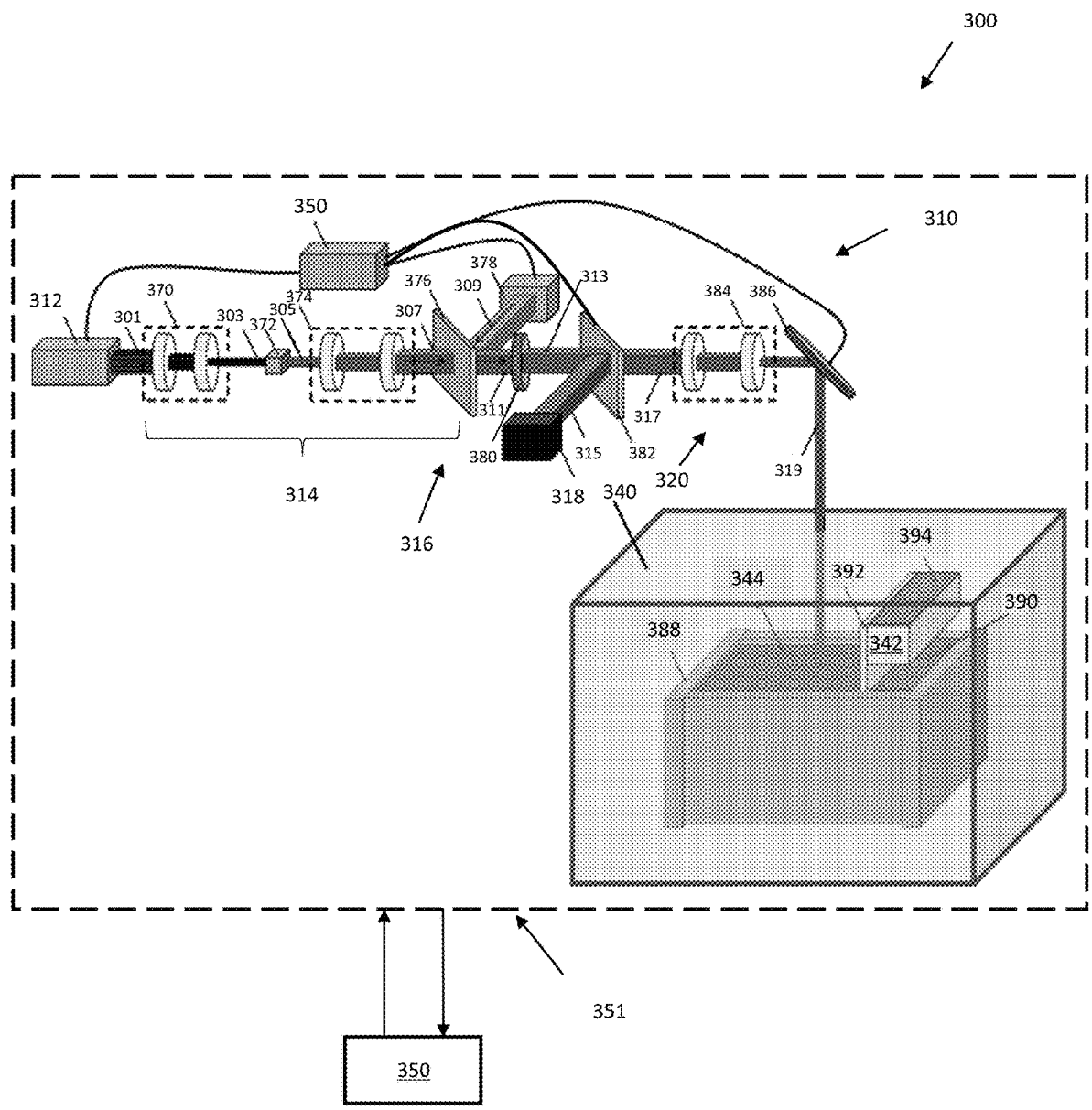
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
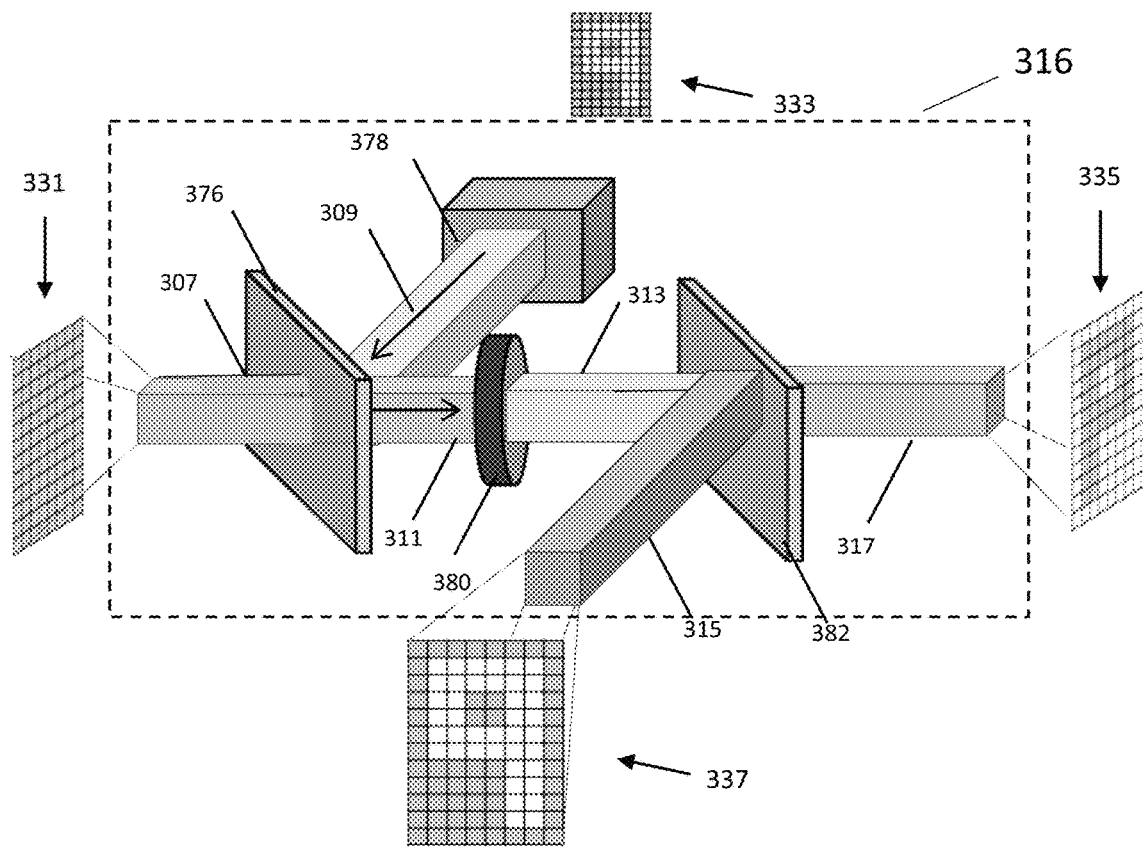
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
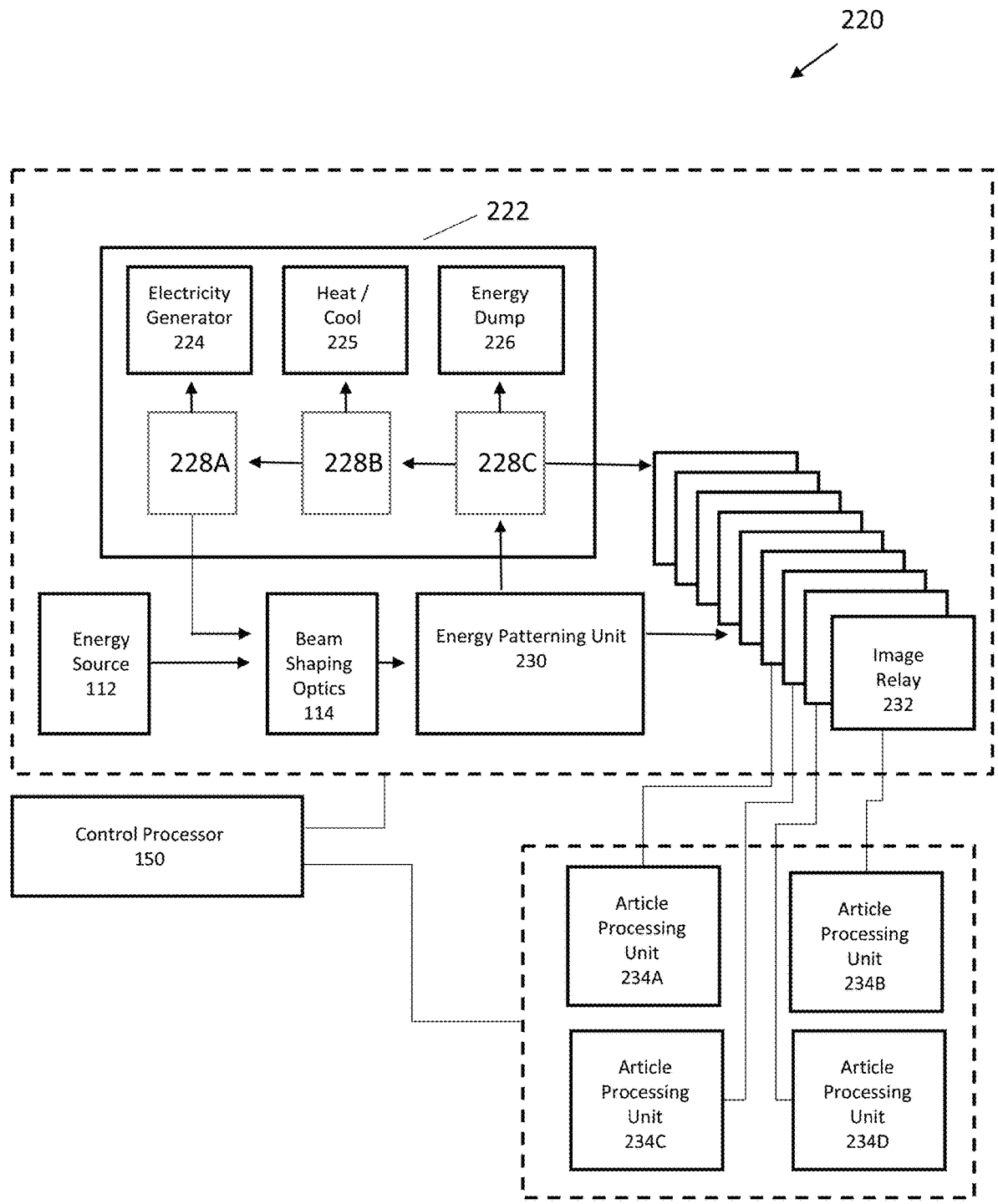
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
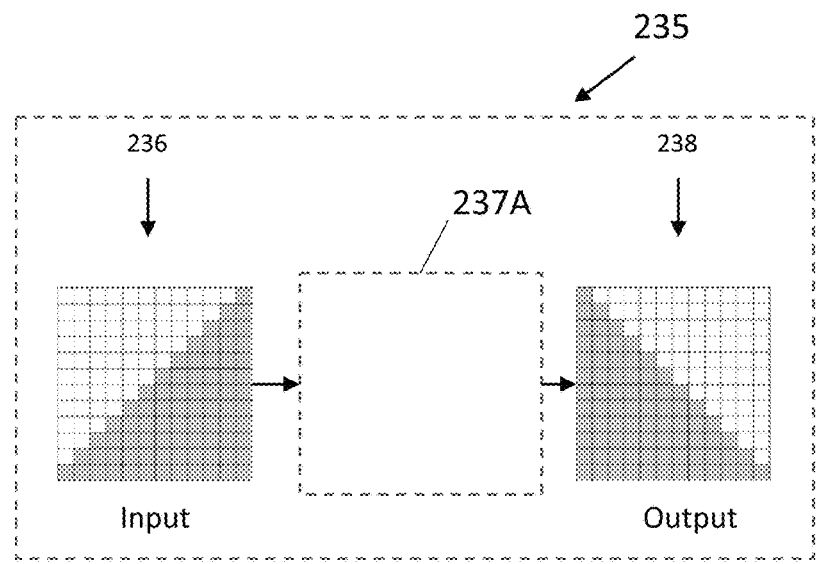
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
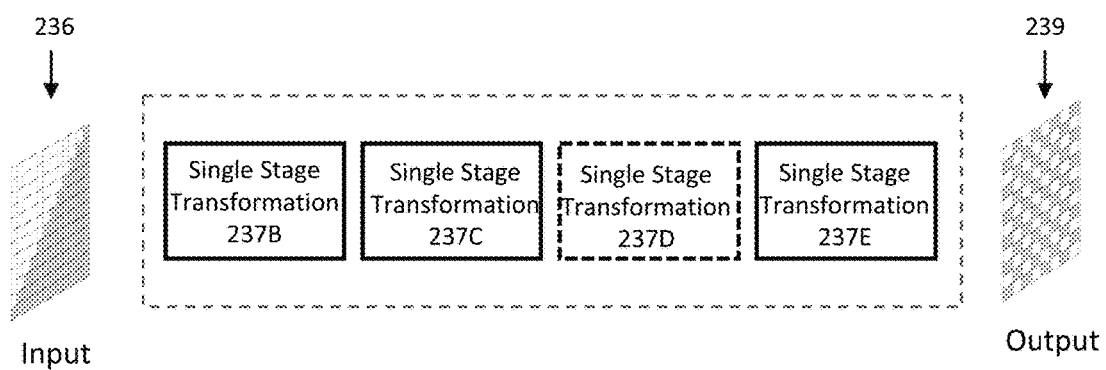
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
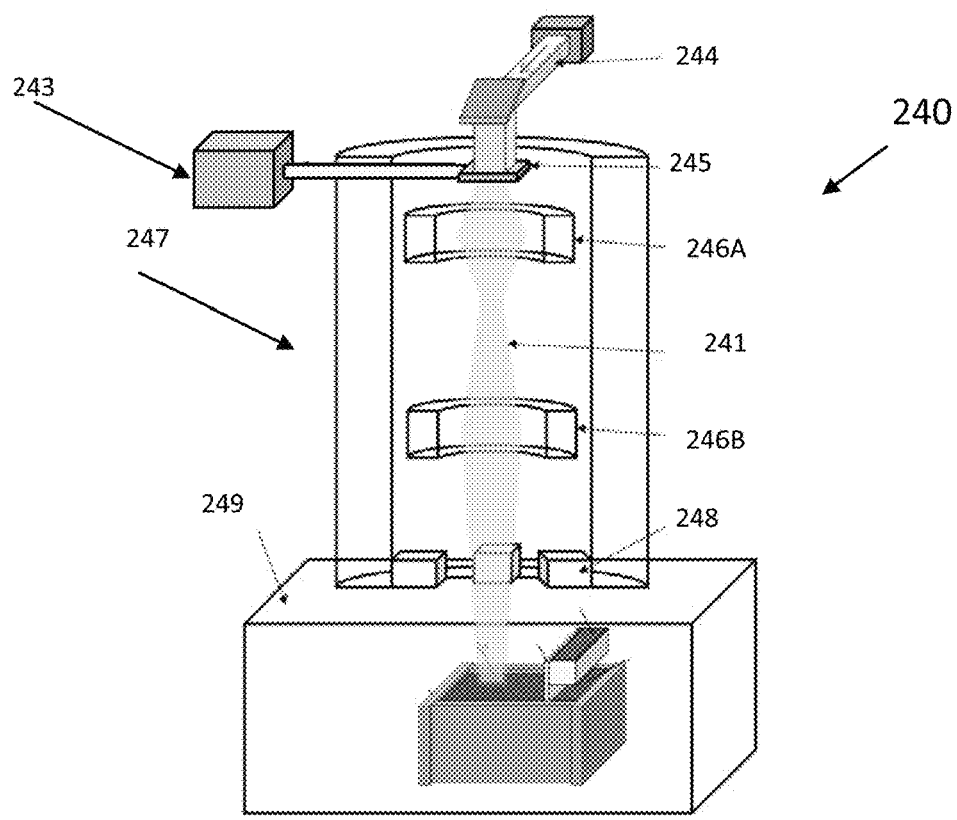
FIG. 3F illustrates an patternable electron energy beam additive manufacturing system.
Figure 3G:
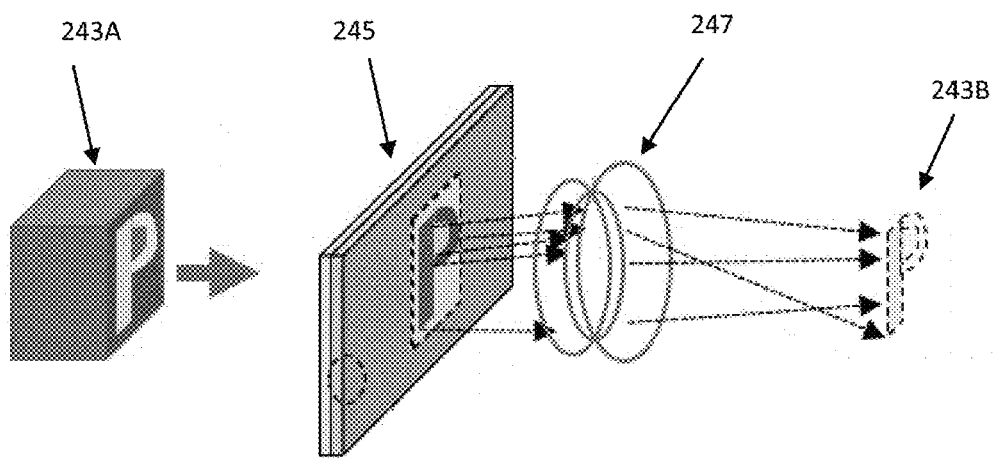
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light.

In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
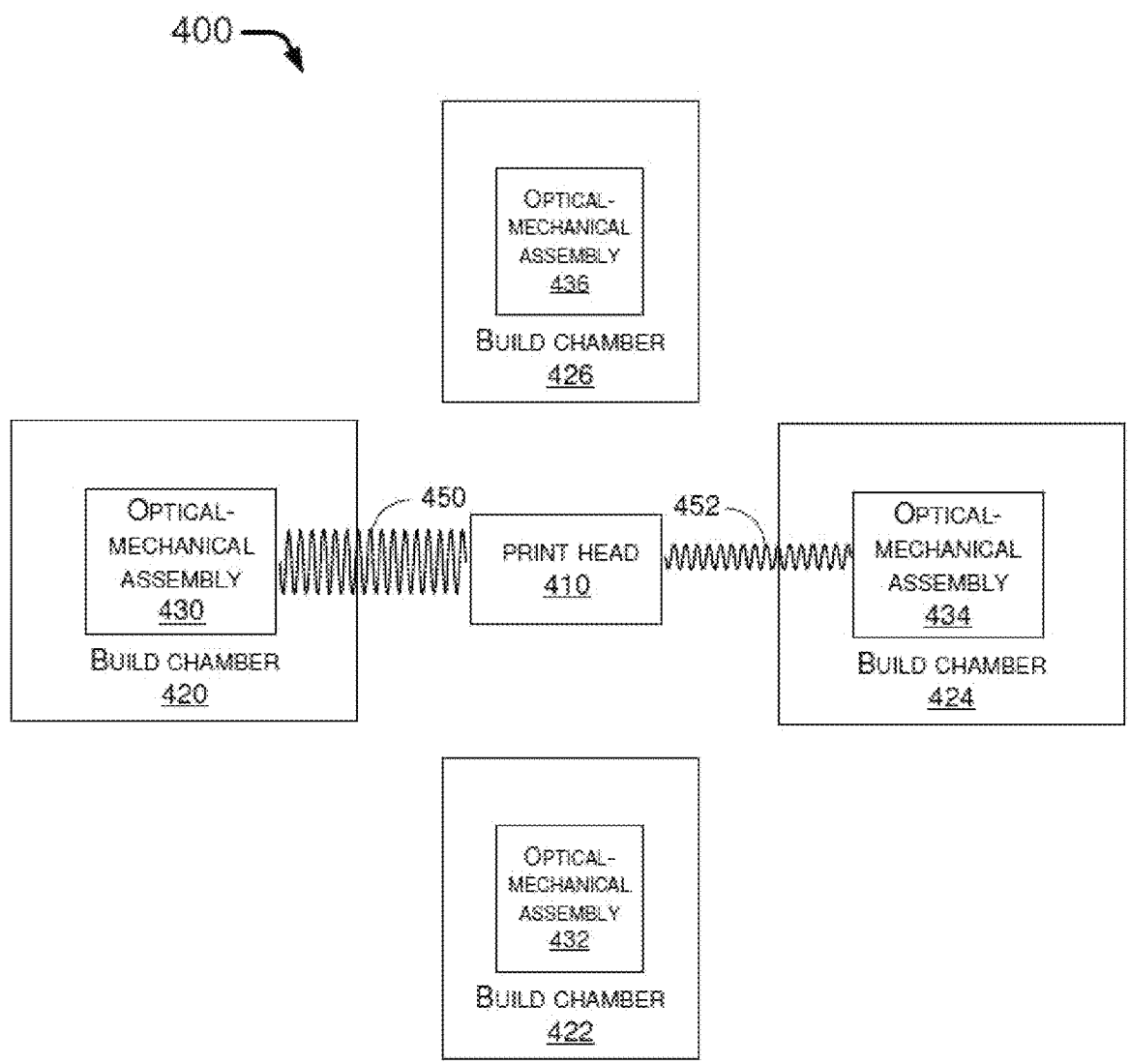
FIG. 4 is an example scenario depicting a concurrent printing process in multiple build chambers in accordance with an embodiment of the present disclosure.

FIG. 4 illustrates an example scenario 400 in which a multiple-chamber approach of powder bed fusion additive manufacturing in accordance with the present disclosure may be utilized. Scenario 400 is an illustrative example of concurrent printing of one or more objects inside one or more respective build chambers 420-426. Each of the build chambers 420-426 may use one or more different powdered materials for a print job each time or may be dedicated to one powdered material to reduce overhead associated with switching powdered materials (such as cleaning to avoid reactions and cross-contaminations between powdered materials). The build chambers 420-426 may have different sizes to best utilize spaces inside the build chambers 420-426 by allocating print jobs according to the sizes of objects to be printed. Scenario 400 may be operated without de-powering of major components such as print head 410. Print head 410 may contain an energy source, energy patterning system, and image relay such as discussed with respect to FIG. 1 of the disclosure. Configured with multiple build chambers, in scenario 400 there is an option to switch print head 410 to other build chambers for a next print job in queue once a current print job is finished, thus eliminating down time caused by the need of removing the printed object and powders in a single-chamber configuration.

A novel approach of modular multiple-chamber printing is also illustrated in scenario 400. The energy source inside print head 410 may be split into multiple incident beams. Print head 410 may contain one or more beam steering drivers capable of directing multiple incident beams to address one or more of the surrounding build chambers 420-426. In FIG. 4, beam 450 and beam 452 are directed by beam steering drivers inside print head 410 towards build chamber 420 and build chamber 424. Build chambers 420-426 may contain powdered materials. Build chambers 420-426 may have different sizes. For example, build chambers 420 and 424 may be 1 meter on each side for a total print area of 1 square meter, and build chambers 422 and 426 may be 80 cm by 140 cm for a total print area of 1.12 square meter. Each of build chambers 420-426 may be equipped with a respective one of optical-mechanical assemblies 430-436 to receive and further direct the incident beams onto the respective build area. In of the example shown in scenario 400, optical assembly 430 receives beam 450 from print head 410 and optical assembly 434 receives beam 452 from print head 410, respectively. Optical assembly 430 and optical assembly 434 may further direct and focus beam 450 and beam 452 onto respective print surfaces inside build chamber 420 and build chamber 424, respectively, to carry out melting processes. In of the example shown in scenario 400, the print head 410 may be designed to print tungsten in build chamber 420 and titanium in build chamber 424, with less energy required in printing titanium. An incident beam emitted by the energy source in print head 410 is split to form beam 450 toward build chamber 420 and beam 452 towards build chamber 424. Energy of beam 452 may have less intensity than energy of beam 450 since titanium has a lower melting point than tungsten. The total intensity of beam 450 and beam 452 may not exceed the maximum output of the energy source inside print head 410.

Powder bed fusion additive manufacturing systems build up objects by spreading a thin layer of a powdered material across a build platform and using an energy source to melt or sinter the powder where desired to create a two-dimensional slice of the object. Lasers may be operated with an optical assembly having a large focal length (depth of field), and as such the optical assembly are typically spaced far from the focal point of the build platform in powder bed fusion additive manufacturing systems equipped with fiber lasers. Laser powder bed fusion manufacturing systems also make top or bottom loading of the powder bed possible within a sealed rectangular or circular walled chamber due to the large focal length.

Semiconductor or diode lasers have a much higher divergence than typical lasers and such, require an optical assembly near the powder bed working in small focal length between the final optic and the print surface. Semiconductor lasers may have other advantages over solid state (e.g. fiber) lasers such as higher efficiency and lower cost per watt, but the small focal length makes traditional top removal of objects larger than the focal length of the semiconductor lasers difficult. It is therefore desirable to use a side access or an access from below for the removal of the powder bed and any printed objects from the build chamber.

Figure 5:
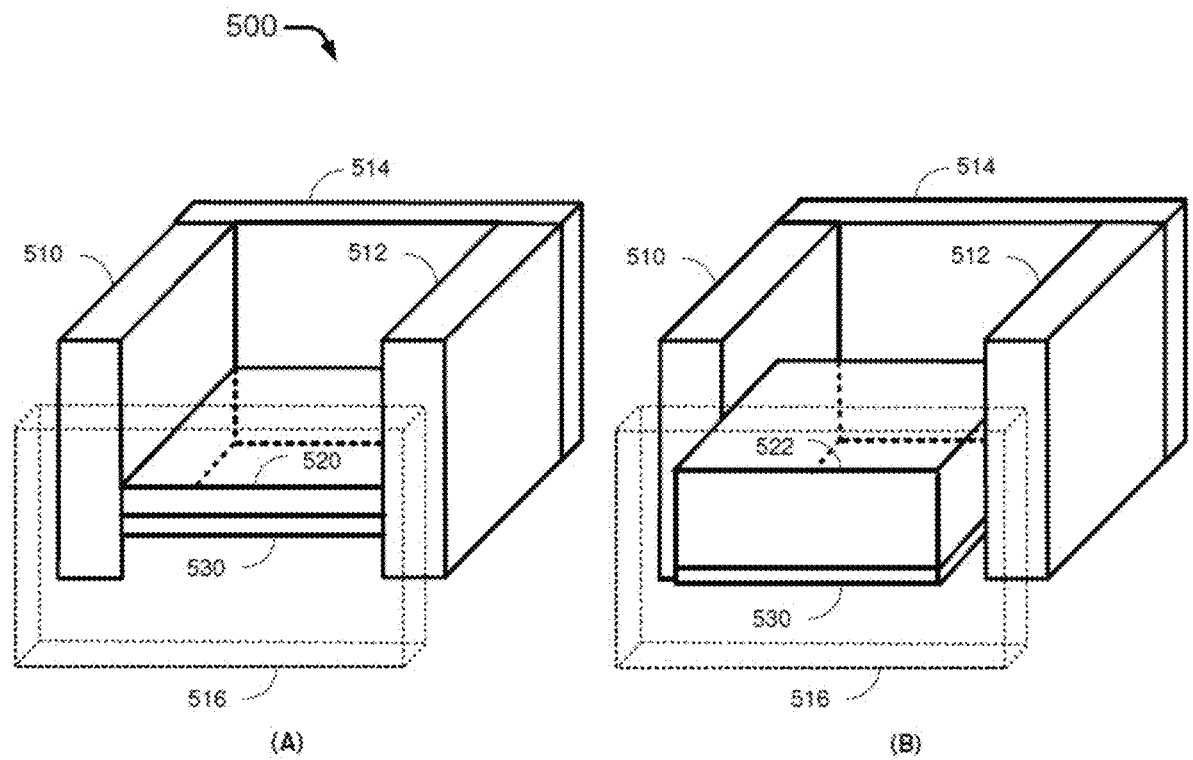
FIG. 5 is an example scenario depicting a side removal of a powder bed upon completion of a print job in accordance with an embodiment of the present disclosure.

FIG. 5 illustrates an example scenario 500 depicting a side removal of a powder bed upon completion of a print job in accordance with an embodiment of the present disclosure. In FIG. 5, a build chamber in accordance with the present disclosure is capable of side removal of powder bed 522 supported by a build platform 530, as shown in part (B) of FIG. 5. The build chamber may include fixed wall 510, wall 512, wall 514 and a removable door 516. Part (A) of FIG. 5 depicts build platform 530 holding powder bed 520 at a starting position before a build process begins. As shown in part (B) of FIG. 5, side removal of build platform 530 holding powder bed 522 after the build process is feasible. Build platform 530 may have an area of 1 meter by 1 meter. Powder bed 522 is thicker than powder bed 520 due to successive depositions of powder layers during the build process. Build platform 530 may be capable of up and down movements in the vertical direction during the build process such that the build chamber may be used in either configuration, whether equipped with semiconductor or solid state lasers, electron beams, or another suitable energy source. Door 516 may be closed to seal the build chamber in a controlled atmosphere during the build process.

Furthermore, the build chamber in accordance with the present disclosure described herein may be configured for quick exchanges of build platforms so that a build platform with a fully built powder bed may be emptied and reset in a separate offline process, while a new and empty build platform may be reloaded quickly to begin a new print cycle. Build platform 530 and door 516 may be removed or reloaded on rails, wheels, or manually. This improves utilization of relatively expensive lasers and build chambers, thereby achieving higher efficiency, throughput, and economic benefits.

The powder bed fusion technique employed for additive manufacturing uses powders that are selectively melted on each layer prior to a new powder layer being added. High resolution printing may require that the distance between the final optics of the laser and the print surface (i.e., the final throw) be managed within a very tight tolerance (the depth of field). As each new powder layer is dispensed, an average relative motion equal to the thickness of each new layer may be required between the top surface (print surface) of the powder bed and the final optics of the laser.

Figure 6:
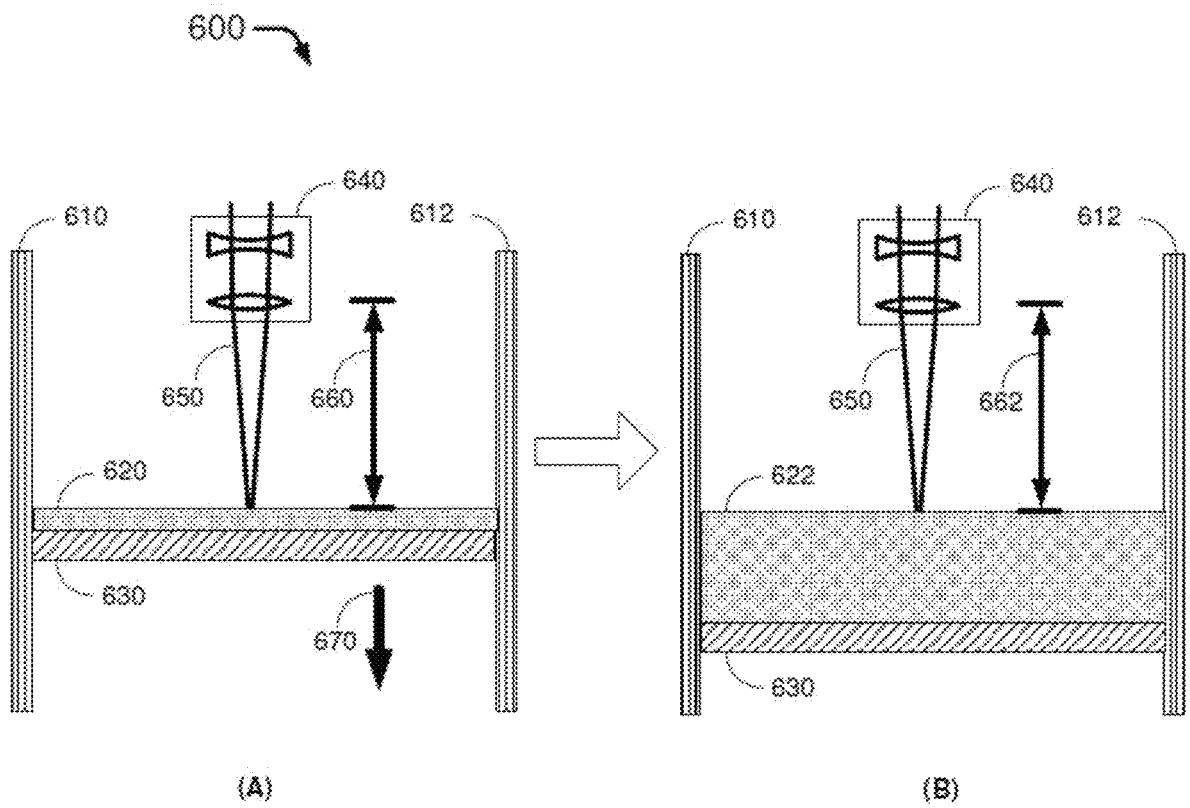
FIG. 6 is an example scenario depicting a control of depth of field by indexing the build platform downwards as layers of powders being successively dispensed in accordance with an embodiment of the present disclosure.

FIG. 6 illustrates an example scenario 600 of controlling a final throw (depth of field) by indexing build platform 630 downwards. Part (A) of FIG. 6 depicts a build platform 630 at a beginning or early-cycle position holding powder bed 620, which is relatively thin. Wall 610 and wall 612 are two sidewalls of the build chamber where build platform 630 is seated. Final optics 640 may receive and focus incident beam 650 onto a top surface (print surface) of powder bed 620. Final optics 640 may be part of optical-mechanical assembly 430, 432, 434 and/or 436 in example scenario 400. Distance 660 between final optics 640 and the top surface of powder bed 620 may be managed to be essentially constant by indexing build platform 630 downwards, by a distance equivalent to a thickness of a powder layer, as shown by arrow 670. Part (B) of FIG. 6 depicts build platform 630 at a final or late-cycle position holding powder bed 622 which is relatively thicker than powder bed 620. Build platform 630 in part (B) of FIG. 6 indexes downwards as each successive powder layer is dispensed over powder bed 622 to keep distance 662 relatively unchanged from distance 660 shown in part (A) of FIG. 6.

Figure 7:
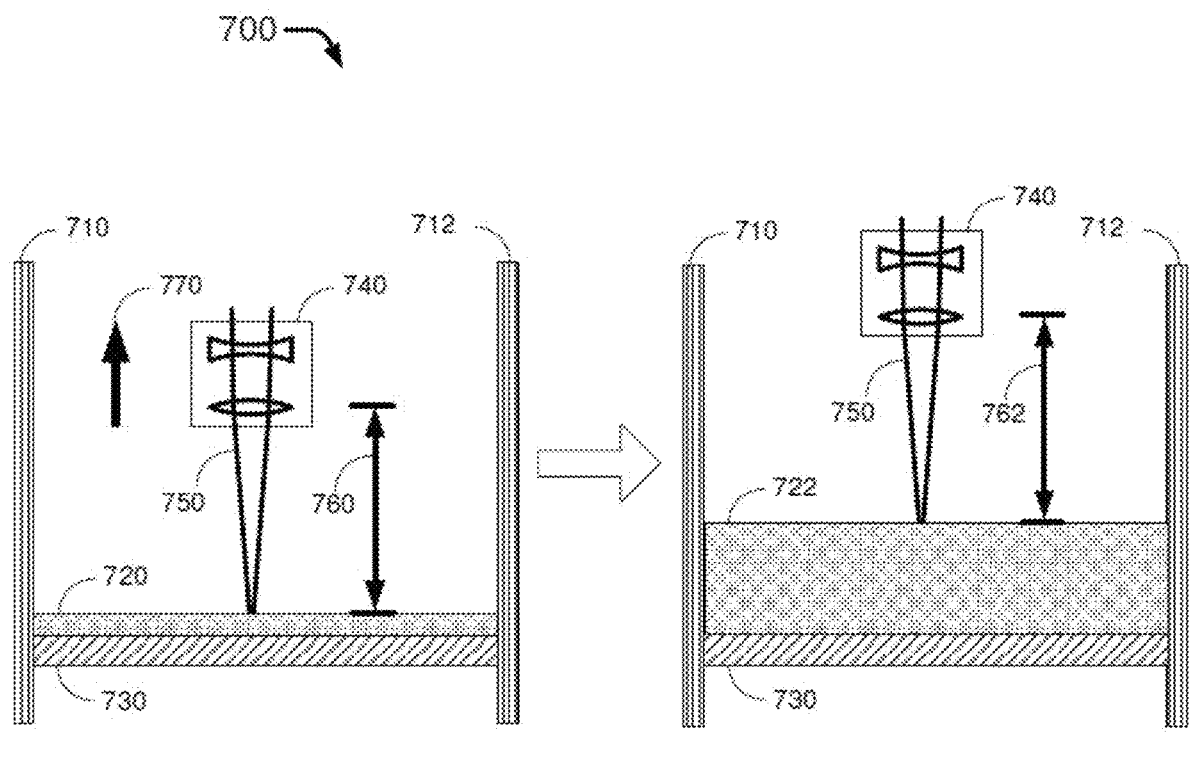
FIG. 7 is an example scenario depicting a control of depth of field by moving the optical-mechanical assembly upwards as layers of powders being successively dispensed in accordance with an embodiment of the present disclosure.

FIG. 7 illustrate another example scenario 700, in accordance with the present disclosure, of controlling a final throw (depth of field) by keeping a build platform 730 at a fixed height and indexing other necessary components upwards. Part (A) of FIG. 7 depicts build platform 730 at a beginning or early-cycle position holding powder bed 720, which is relatively thin. Wall 710 and wall 712 are two sidewalls of the build chamber where build platform 730 is seated. Final optics 740 may receive and focus incident beam 750 onto a top surface (print surface) of powder bed 720. Final optics 740 may be part of optical-mechanical assembly 430, 432, 434 and/or 436 in example scenario 400. Distance 760 between final optics 740 and the top surface of powder bed 720 may be managed to be essentially constant by indexing final optics 740 upwards, by a distance equivalent to a thickness of a powder layer, as shown by arrow 770, while keeping build platform 730 at a fixed height. Part (B) of FIG. 7 depicts build platform 730 at a final or late-cycle position holding powder bed 722, which is relatively thicker than powder bed 720. Final optics 740 in part (B) of FIG. 7 indexes upwards as each successive powder layer is dispensed over powder bed 722 to keep distance 762 relatively unchanged from distance 760 shown in part (A) of FIG. 7.

Example scenario 700 carries advantages over example scenario 600 in building large and heavy objects as it may be quicker and more cost effective to move lighter components in a powder bed fusion additive manufacturing system. As an example, consider that the density of steel is approximately 7,850 kg/m$^3$, and steel powder is typically ~60% of full density. The weight of the print head, powder dispensing unit, and portion of their supporting structure including the optical assembly generally may weigh considerably less than 500-1,000 kg. Consequently, build chambers intended for steel with a volume more than ~0.1-0.2 cubic meters (i.e., greater than 100-200 liters or heavier than 500-1,000 kg) may benefit from keeping the build platform at a fixed height as described in example scenario 700. A similar analysis may be made for other metal powders with different densities.

Furthermore, the thickness of a powder layer may typically be around the order of 25 microns. Maintaining accuracy and repeatability layer by layer at this level may be difficult when indexing a powder bed that is supporting a wide-range variable mass.

Figure 8:
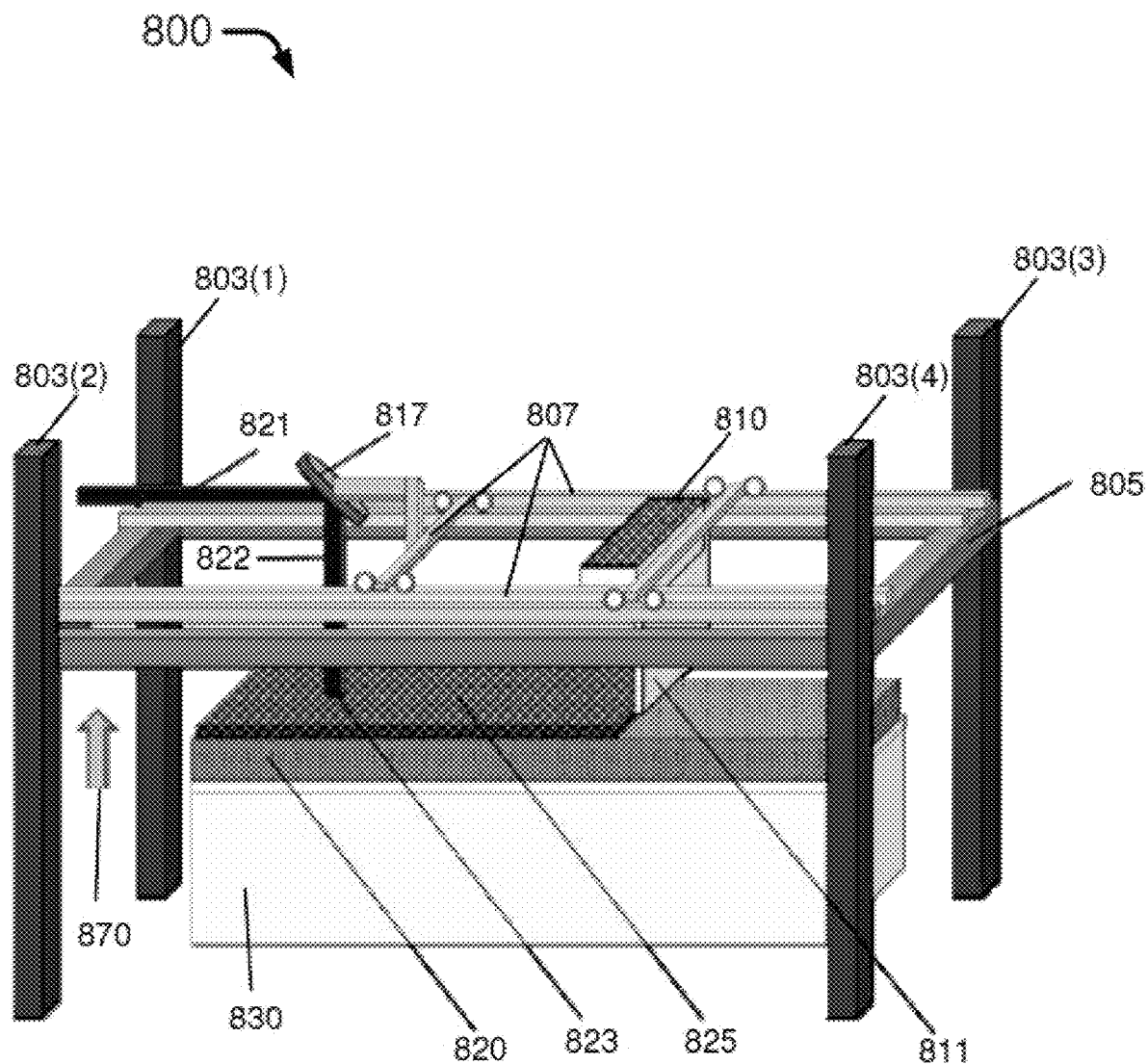
FIG. 8 is an example scenario illustrating upward movement of the gantry table together with the powder dispensing unit relative to the fixed powder bed during a build process.

FIG. 8 illustrates an example scenario 800 of an intermediate point in a powder bed fusion additive manufacturing printing process in accordance with the present disclosure. Example scenario 800 may be similar to example scenario 700, showing upward movements of additional components in the build chamber while controlling the depth of field with a stationary build platform 830. Build platform 830 may have an area of 0.5 meter by 1 meter on which powders may be dispensed during a print cycle. In one embodiment, build platform 830 is moved into position beneath gantry table 805 and locked into position. Vertical columns 803(1)-803(4), each of which at a height of 3 meters, support a gantry 807 mounted on the gantry table 805. A powder dispensing unit 810, a compacting functionality 811, and a mirror 817, which may be part of optical-mechanical assembly 430, 432, 434 and/or 436 in example scenario 400, may be mounted on gantry 807 for translational movements in a horizontal plane. Gantry table 805 is shown at a position higher above powder bed 820 in FIG. 8 to reflect that printing may be in progress. Powder bed 820 contains both powder layers and printed object(s) in various stages of completion. A new layer of powders 825 is dispensed from powder dispensing unit 810 that includes powder spreading and compacting. Beam 821 incident from print head (not shown) may be reflected off a mirror 817 to become beam 822 impinging upon a location 823 in the new layer of powders 825. Printing can occur by melting, sintering, fusing, or otherwise amalgamating of powders at location 823 in the new layer of powders 825. The distance between mirror 817 and the location 823 in the new layer of powders 825 is the depth of field that needs to be tightly controlled to satisfy a resolution requirement. An arrow 870 indicates an upward movement of gantry table 805, which supports gantry 807, powder dispensing unit 810, mirror 817, and in certain embodiments, a surrounding chamber or wall. During this process, the build platform 830 remains locked into place, and the gantry 807 (and/or chamber and chamber wall) moves relative the build platform 830. This arrangement is particularly useful for embodiments discussed below, in which the build platform 830 is large, and will need to support a large amount of heavy material that is not easily moved in a vertical direction with required precision.

In some embodiments, build platform 830 of example scenario 800 may have an area of more than 0.25 square meters. Alternatively, build platform 830 of example scenario 800 may have an area of more than 0.5 square meters. Alternatively, build platform 830 of example scenario 800 may have an area of more than 1 square meters. Alternatively, build platform 830 of example scenario 800 may have an area of more than 5 square meters. Alternatively, build platform 830 of example scenario 800 may have an area of more than 10 square meters. Alternatively, build platform 830 of example scenario 800 may have an area of more than 50 square meters.

In some embodiments, powder bed 820 including the printed object of example scenario 800 may have a mass of more than 10 kilograms. Alternatively, powder bed 820 including the printed object of example scenario 800 may have a mass of more than 50 kilograms. Alternatively, powder bed 820 including the printed object of example scenario 800 may have a mass of more than 100 kilograms. Alternatively, powder bed 820 including the printed object of example scenario 800 may have a mass of more than 500 kilograms. Alternatively, powder bed 820 including the printed object of example scenario 800 may have a mass of more than 1,000 kilograms. Alternatively, powder bed 820 including the printed object of example scenario 800 may have a mass of more than 5,000 kilograms. Alternatively, powder bed 820 including the printed object of example scenario 800 may have a mass of more than 10,000 kilograms.

In some embodiments, build platform 830 of example scenario 800 may have an area of more than 0.25 square meters and powder bed 820 including the printed object of example scenario 800 may have a mass of more than 10 kilograms.

Powder bed fusion technique process powdered materials to form integral objects out of metal, ceramic, and plastic powders. Sufficient energies are needed to bring powders to the respective melting/sintering/alloying temperatures, or phase transition temperatures. If a powdered material starts out closer to its phase transition temperature, less energy may be required to complete the phase transition. The powder bed fusion additive manufacturing may benefit from pre-heating of the powder bed to reduce the amount of energy delivered by the lasers or other energy sources. This may allow using a lower intensity laser and less dwell time to bond a powder, increasing the throughput rate.

Post processing heat treatments may be required for some powdered materials such as metals to mitigate stress concentrations and increase mechanical strengths. Post processing heat treatments may include a controlled-temperature anneal or a fast cooling to improve desired mechanical or electrical properties. Pre-heating of powders and post processing heat treatments may be achieved by embedding heating/cooling element(s)/temperature sensor(s) inside walls of a build chamber/inside a build platform and controlling the rate of heating/cooling with a feedback algorithm. Heat loss may be reduced by using insulating materials inside walls of a build chamber.

Build chambers 420, 422, 424 and 426 of example scenario 400 may be implemented as build chambers in scenarios 500, 600, 700 and 800 described above and scenario 900 described below, as well as build chambers 1020(1)-1020(N) of example apparatus described below. Therefore, functions and capabilities of build chambers 420, 422, 424 and 426 apply to build chambers in scenarios 500, 600, 700 and 800 described above and scenario 900, as well as build chambers 1020(1)-1020(N) of example apparatus described below. Accordingly, for the interest of brevity, functions and capabilities other than for build chambers 420, 422, 426 and 426 are not provided below to avoid redundancy.

Build platform 530 of example scenario 500 may be implemented as build platform 630 of example scenario 600, build platform 730 of example scenario 700, build platform 830 of example scenario 800, build platform 1 of example scenario 900, as well as build platform 1024(1)-1024(N) of example apparatus described below. Therefore, functions and capabilities of build platform 530 apply to build platform 630 of example scenario 600, build platform 730 of example scenario 700, build platform 830 of example scenario 800, build platform 1 of example scenario 900, as well as build platform 1024(1)-1024(N) of example apparatus described below. Accordingly, for the interest of brevity, functions and capabilities other than for build platform 530 are not provided below to avoid redundancy.

In some embodiments, each of build chamber 420, 422, 424 and 426 may include resistive heating elements embedded inside in the walls/ceilings of build chamber 420, 422, 424 and 426.

In some embodiments, each of build chamber 420, 422, 424 and 426 may include active thermal regulation systems such as fluid channels embedded inside in the walls/ceilings of build chamber 420, 422, 424 and 426. The fluid may be heated or cooled outside build chamber 420, 422, 424 and 426, and perform heat exchange with the walls/ceilings by moving fluid through the fluid channel. The fluid may include, but not limited to, an oil, water, steam, air, nitrogen, argon, or a coolant.

In some embodiments, each of build chamber 420, 422, 424 and 426 may include active thermal regulation systems such as thermionic cooling elements embedded inside in the walls/ceilings of build chamber 420, 422, 424 and 426.

In some embodiments, each of build chamber 420, 422, 424, and 426 may include thermocouples embedded inside in the walls/ceilings of build chamber 420, 422, 424 and 426 to monitor temperatures inside build chambers 420, 422, 424 and 426.

In some embodiments, build platform 530 may include resistive heating elements embedded inside build platform 530.

In some embodiments, build platform 530 and walls 510, 514, 516 may include active thermal regulation systems such as fluid channels embedded inside build platform. The fluid may be heated or cooled outside build platform 530 and walls 510, 514, 516, and perform heat exchange with the walls/ceilings by moving fluid through the fluid channel. The fluid may include, but not limited to, an oil, water, steam, air, nitrogen, argon, or a coolant.

In some embodiments, build platform 530 and walls 510, 514, 516 may include active thermal regulation systems such as thermionic cooling elements embedded inside build platform 530.

In some embodiments, each of build platform 530 and walls 510, 514, 516 may include thermocouples embedded inside build platform 530 to monitor temperatures of powder bed 520.

In some embodiments, each of build chamber 420, 422, 424 and 426 may include an infrared camera looking at a powder bed to monitor temperatures of the powder bed.

In some embodiments, each of build chamber 420, 422, 424 and 426 may include an infrared camera looking at the walls/ceilings of build chamber 420, 422, 424 and 426 through its own optic system.

In some embodiments, each of build chamber 420, 422, 424 and 426 may include an infrared camera spliced into beam 450 through spectral or polarization beam combining.

In some embodiments, each of build chamber 420, 422, 424 and 426 may include radiation shields on the walls/ceilings of build chamber 420, 422, 424 and 426 to reduce heat loss.

In some embodiments, each of build chamber 420, 422, 424 and 426 may include passive thermal regulation systems such as low thermal conductance materials as part of walls/ceilings of build chamber 420, 422, 424 and 426 to reduce heat loss.

In some embodiments, each of build chamber 420, 422, 424 and 426 may be capable of controlling the thermal environment of the powder bed fusion before, during, and after a print process using active or passive thermal regulation systems.

Figure 9:
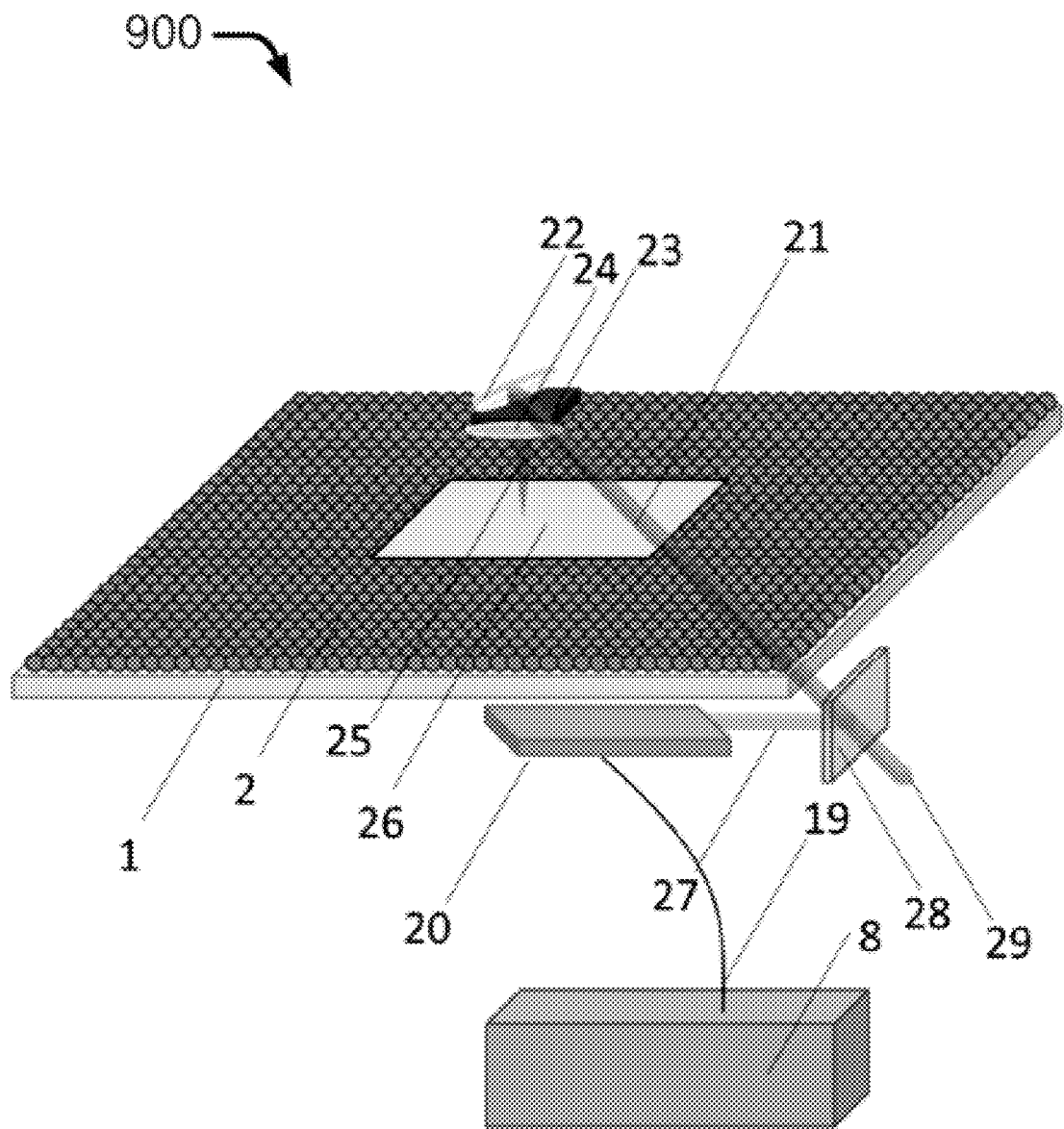
FIG. 9 is an example scenario depicting a control of the temperature of a powder bed inside a build chamber in accordance with an embodiment of the present disclosure.

FIG. 9 illustrates example scenario 900 of controlling a temperature of powder bed 2 using infrared camera 20 and processor 8 during a build. In FIG. 9, build platform 1 may be one square meter in area which supports powder bed 2. Infrared camera 20 may be mounted on one of the walls inside a build chamber. Infrared light beam 25, emitted from print area 26, may travel back up the print system optics through final lens 24 and mirror 22 into beam 21. Final lens 24 and mirror 22 may be mounted on build platform gantry 23. Beam 21 may be split off by hot/cold mirror 19, which may transmit 1000 nm light and reflects wavelengths above 1100 nm, into beam 27 and beam 29. Infrared camera 20 may read a temperature of powder bed 2 from beam 29. Processor 8 may receive data via cable 19 from infrared camera 20. Processor 8 may further control heating/cooling element inside build platform 1 to maintain a target temperature of powder bed 2.

Figure 10:
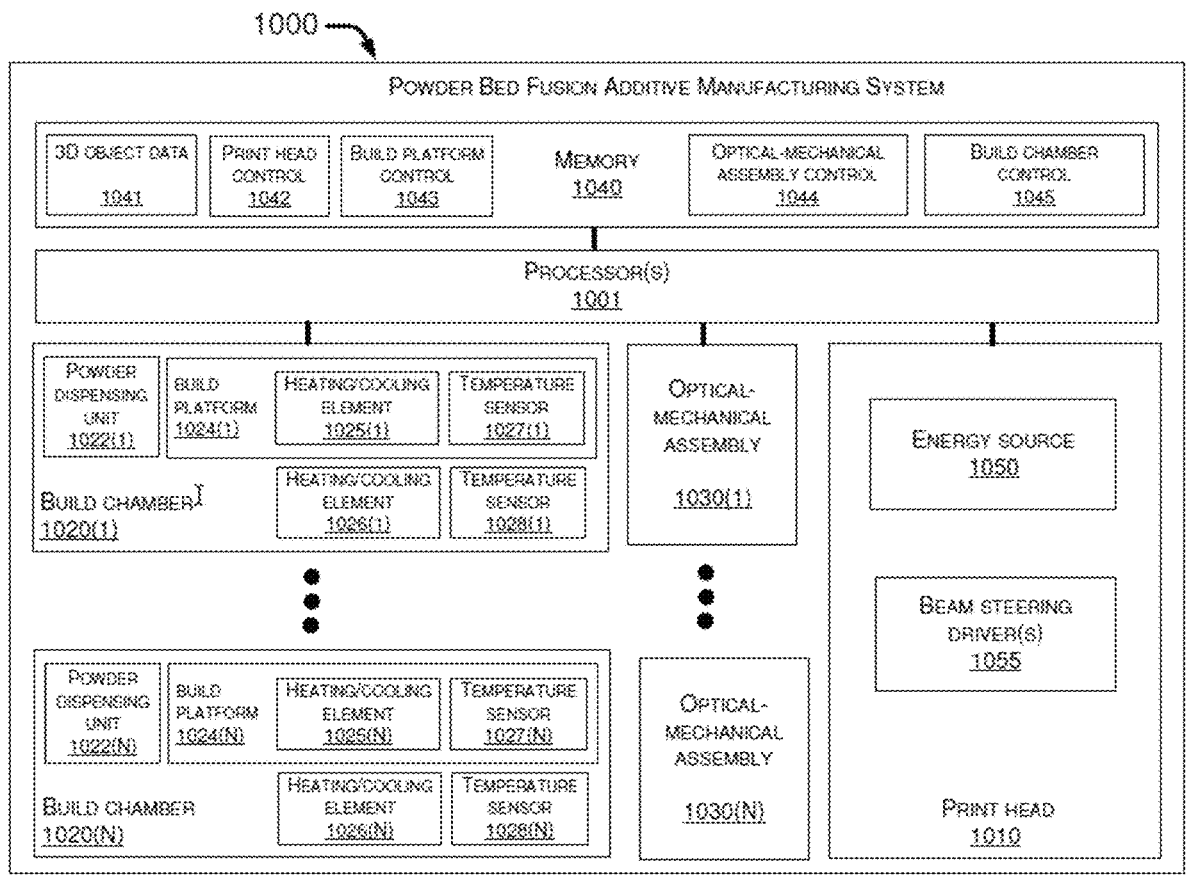
FIG. 10 is block diagram depicting an example apparatus of a laser-based powder bed fusion additive manufacturing system in accordance with an embodiment of the present disclosure.

FIG. 10 illustrates an example apparatus of laser-based powder bed fusion additive manufacturing system 1000 in accordance with an embodiment of the present disclosure. Laser-based powder bed fusion additive manufacturing system 1000 may perform various functions related to techniques, methods and systems described herein, including those described above with respect to scenario 400, 500, 600, 700, 800 and 900 as well as those described below with respect to process 1100. Laser-based powder bed fusion additive manufacturing system 1000 may be implemented in scenario 400, 500, 600, 700, 800 and 900 to effect various embodiments in accordance with the present disclosure. Laser-based powder bed fusion additive manufacturing system 1000 may include at least some of the components illustrated in FIG. 10.

In some embodiments, laser-based powder bed fusion additive manufacturing system 1000 may include one or more build chambers. For illustrative purpose and without limitation, one or more build chambers of system 1000 are shown in FIG. 10 as build chambers 1020(1)-1020(N), with N being a positive integer greater than or equal to 1. Build chambers 1020(1)-1020(N) may include powder dispensing units 1022(1)-1022(N) for dispensing powdered materials and build platforms 1024(1)-1024(N) to support powder beds formed by powdered materials. Each of build chambers 1020(1)-1020(N) may have a different size and may be swappable among each other within powder bed fusion additive manufacturing system 1000. Build chambers 1020(1)-1020(N) may have removable doors to facilitate powder removal from a side of build chambers 1020(1)-1020(N) after a build. Build chambers 1020(1)-1020(N) may be sealed in an atmosphere during powder bed fusion additive manufacturing. The atmosphere may include, but not limited to, air, nitrogen, argon, or helium.

In some embodiments, walls/ceilings of build chambers 1020(1)-1020(N) may be embedded with heating/cooling elements 1026(1)-1026(N) and temperature sensors 1028(1)-1028(N) to control the thermal environment inside build chambers 1020(1)-1020(N).

In some embodiments, heating/cooling elements 1026(1)-1026(N) may be fluid channels capable of heat exchange. The fluid may be heated or cooled outside build chambers 1020(1)-1020(N) and perform heat exchange with the walls/ceilings by moving fluid through the fluid channels. The fluid may include, but not limited to, an oil, water, steam, air, nitrogen, argon, or a coolant.

In some embodiments, heating/cooling elements 1026(1)-1026(N) may be resistive heating elements and thermionic cooling elements respectively.

In some embodiments, temperature sensors 1028(1)-1028(N) may be thermocouples embedded inside walls/ceilings of inside build chambers 1020(1)-1020(N).

In some embodiments, temperature sensors 1028(1)-1028(N) may be infrared camera(s) mounted on walls/ceilings inside build chambers 1020(1)-1020(N).

In some embodiments, each of build chambers 1020(1)-1020(N) may include radiation shields on walls/ceilings of build chambers 1020(1)-1020(N) to reduce heat loss.

In some embodiments, build chambers 1020(1)-1020(N) may include low thermal conductance materials as parts of walls/ceilings.

In some embodiments, each of build platforms 1024(1)-1024(N) may be capable of vertical motions or being fixed at a given height during powder bed fusion additive manufacturing. Build platforms 1024(1)-1024(N) may have different sizes and support variable masses of powder beds. Build platforms 1024(1)-1024(N) may be removable from build chambers 1020(1)-1020(N) on rails, wheels or other means.

In some embodiments, each of build platforms 1024(1)-1024(N) may be embedded with heating/cooling elements 1025(1)-1025(N) and temperature sensors 1027(1)-1027(N).

In some embodiments, heating/cooling elements 1025(1)-1025(N) may be fluid channels capable of heat exchange. The fluid may be heated or cooled outside build chambers 1020(1)-1020(N) and perform heat exchange with the walls/ceilings by moving fluid through the fluid channels. The fluid may include, but not limited to, an oil, water, steam, air, nitrogen, argon, or a coolant.

In some embodiments, heating/cooling elements 1025(1)-1025(N) may be resistive heating elements and thermionic cooling elements respectively.

In some embodiments, temperature sensors 1027(1)-1027(N) may be thermocouples embedded inside walls/ceilings of inside build chambers 1020(1)-1020(N).

In some embodiments, each of build platforms 1024(1)-1024(N) may have an area of more than 0.25 square meters. Alternatively, each of build platforms 1024(1)-1024(N) may have an area of more than 0.5 square meters. Alternatively, each of build platforms 1024(1)-1024(N) may have an area of more than 1 square meters. Alternatively, each of build platforms 1024(1)-1024(N) may have an area of more than 5 square meters. Alternatively, each of build platforms 1024(1)-1024(N) may have an area of more than 10 square meters. Alternatively, each of build platforms 1024(1)-1024(N) may have an area of more than 50 square meters. In some embodiments, each of build platforms 1024(1)-1024(N) may support a mass of more than 10 kilograms. Alternatively, each of build platforms 1024(1)-1024(N) may support a mass of more than 50 kilograms. Alternatively, each of build platforms 1024(1)-1024(N) may support a mass of more than 100 kilograms. Alternatively, each of build platforms 1024(1)-1024(N) may support a mass of more than 500 kilograms. Alternatively, each of build platforms 1024(1)-1024(N) may support a mass of more than 1,000 kilograms. Alternatively, each of build platforms 1024(1)-1024(N) may support a mass of more than 5,000 kilograms. Alternatively, each of build platforms 1024(1)-1024(N) may support a mass of more than 10,000 kilograms.

In some embodiments, each of build platforms 1024(1)-1024(N) may have an area of more than 0.25 square meters and build platforms 1024(1)-1024(N) may support a mass of more than 10 kilograms.

Powder bed fusion additive manufacturing system 1000 may include optical-mechanical assemblies 1030(1)-1030(N) associated with build chambers 1020(1)-1020(N) respectively for directing incident beams onto respective build area inside build chambers 1020(1)-1020(N).

Optical-mechanical assemblies 1030(1)-1030(N) may include convex lenses, concave lenses, mirrors, electro-optic components, polarization control components, and other reflective/refractive components. Optical-mechanical assemblies 1030(1)-1030(N) may further include a mechanical structure configured to support and adjust positions or angles of convex lenses, concave lenses, mirrors, and other reflective/refractive components.

In some embodiments, optical-mechanical assemblies 1030(1)-1030(N) may be height adjustable in a vertical direction during powder bed fusion additive manufacturing.

Powder bed fusion additive manufacturing system 1000 may include print head 1010 capable of providing one or more incident beams to build chambers 1020(1)-1020(N). Print head 1010 may further include energy source 1050 and beam steering driver(s) 1055. Energy source 1050 may be laser, electron beam, or another suitable source capable of generating enough beam intensity to melt/sinter/alloying powdered materials. Beam steering driver(s) may include reflective/refractive optical components to split a main beam into multiple incident beams for respective build chambers 1020(1)-1020(N).

In some embodiments, print head 1010 may be height adjustable in a vertical direction together with optical-mechanical assemblies 1030(1)-1030(N) during powder bed fusion additive manufacturing.

In some embodiments, powder bed fusion additive manufacturing system 1000 may include memory device 1040 configured to store 3D object data 1041, programs/instructions for print head control 1042, build platform control 10443, optical-mechanical assembly control 1044, and build chamber control 1045. 3D object data 1041 may contain geometrical information of two dimensional slices of a 3D object. Print head control 1042 may contain means for controlling an intensity, a direction, a timed duration of incident beams. Build platform control may contain programs for controlling a temperature and a height of a respective build platform. Optical-mechanical assembly control may contain programs for controlling a height of a respective optical-mechanical assembly and a location of the incident beam on a powder bed. Build chamber control 1045 may contain programs for controlling powder dispensing and a temperature of the powder bed inside a respective build chamber, In some embodiments, powder bed fusion additive manufacturing system 1000 may include a processor 1001. Processor 1001 may be coupled to memory device 1040 to access data stored therein and to execute any programs/instructions stored therein. Processor 1001 may determine how many 3D objects can be printed concurrently based on total energy requirement of bonding the powdered materials that form the 3D objects. Processor 1001 may then determine an intensity and a timed duration of the respective incident beam for each 3D object. Assignments of build chambers 1020(1)-1020(N) for the 3D objects to be printed concurrently may be based on the size of the 3D object or based on previously processed powdered materials inside build chambers 1020(1)-1020(N). Processor 1001 may execute print head control 1042 to set an intensity and a timed duration for an incident beam, and beam steering drive(s) 1055 may direct each incident beam towards the respective build chamber. Processor 1001 may receive 3D object data from memory 1040 to coordinate movements of optical-mechanical assemblies 1030(1)-1030(N) according to the geometrical information of two dimensional slices of the 3D object. Optical-mechanical assembly control 1044 may focus the incident beam on the top surface of the powder bed and allow the incident beam following the geometrical information of two dimensional slices during powder bed fusion additive manufacturing. Processor 1001 may further execute build chamber control 1045 to control powder dispensing such as layer thickness, rate of dispensing, and compaction. Temperature data from temperature sensors 1028(1)-1028(N) may be received by processor 1001 and a temperature control algorithm in build chamber control 1045 may determine to heat or cool the respective build chamber according to processing requirements. During a build, processor 1001 may execute build platform control 1043 to index build platforms 1024(1)-1024(N) downwards to maintain an essentially constant depth of field as layers of powders are being successively dispensed on to the powder bed.

In some embodiments, build platforms 1024(1)-1024(N) may be locked at a fixed height during a build as layers of powders are being successively dispensed onto the powder bed. Processor 1001 may control print head 1010 and optical-mechanical assemblies 1030(1)-1039(N) indexing upwards to maintain an essentially constant depth of field as opposed to downward movements of build platforms 1024 (1)-1024(N).

Figure 11:
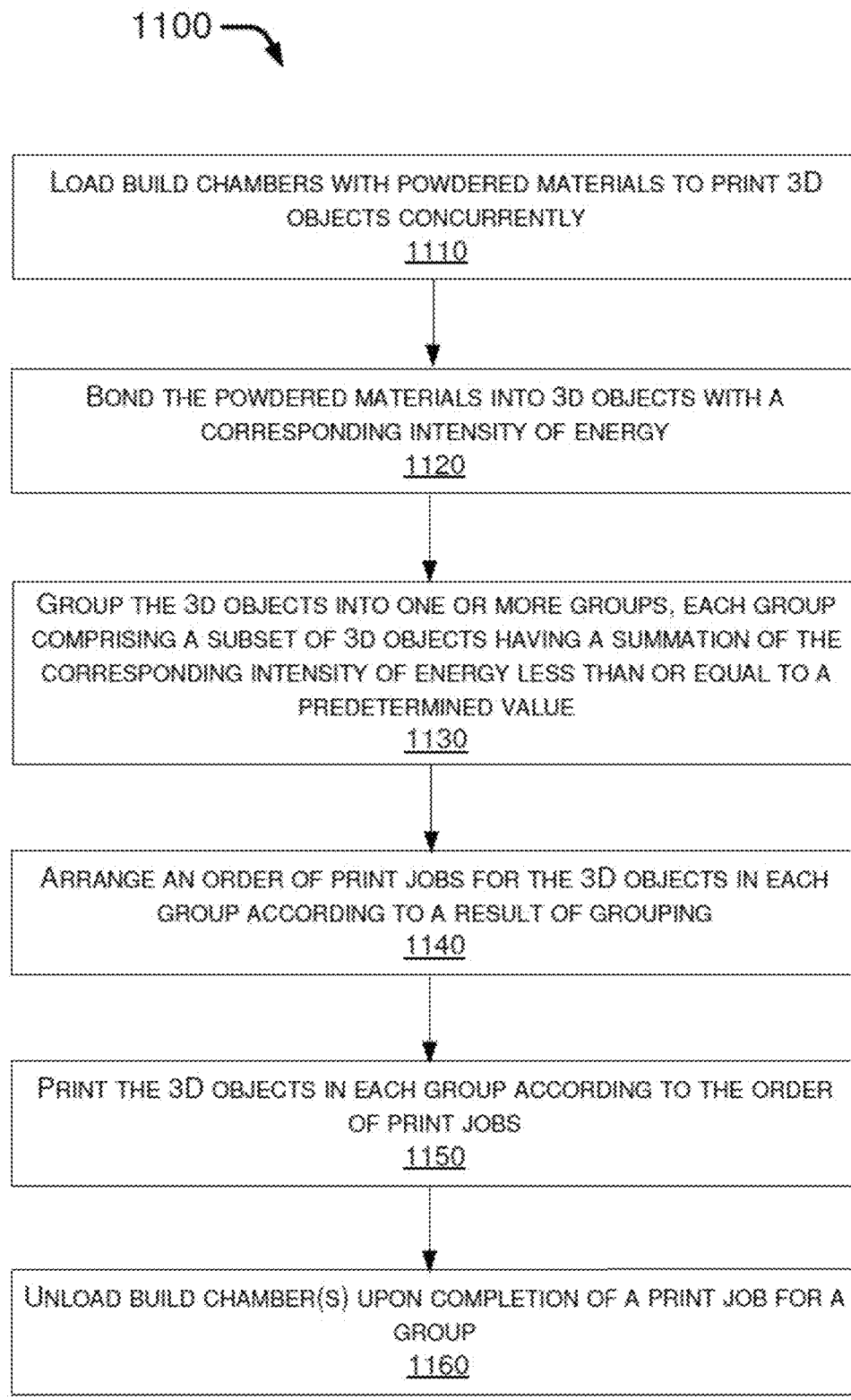
FIG. 11 is a block diagram depicting a process flow of concurrent printing in a powder bed fusion additive manufacturing system with multiple build chambers in accordance with an embodiment of the present disclosure.

FIG. 11 illustrates an example process 1100 in accordance with the present disclosure. Process 1100 may be utilized to print one or more 3D objects concurrently in accordance with the present disclosure. Process 1100 may include one or more operations, actions, or functions shown as blocks such as 1110, 1120, 1130, 1140, 1150, and 1160. Although illustrated as discrete blocks, various blocks of process 1100 may be divided into additional blocks, combined into fewer blocks, or eliminated, depending on the desired implementation, and may be performed or otherwise carried out in an order different from that shown in FIG. 11. Process 1100 may be implemented by powder bed fusion additive manufacturing system 1000. For illustrative purposes and without limiting the scope of process 1100, the following description of process 1100 is provided in the context of scenario 400 as being implemented powder bed fusion additive manufacturing system 1000. Process 1100 may begin with block 1110.

At 1110, process 1100 may involve operator(s) of a powder bed fusion additive manufacturing system 1000 loading one or more build chambers of build chamber 1020(1)-1020(N) with one or more powdered materials to print one or more 3D objects respectively. The powdered materials may include metal, ceramic, and plastics powders. Assignments of build chamber 1020(1)-1020(N) for the 3D objects may be based on the size of the 3D object. Process 1100 may further involve processor 1001 of powder bed fusion additive manufacturing system 1000 obtaining 3D object data 1041 for the one or more 3D objected to be printed. Process 1100 may proceed from 1110 to 1120.

At 1120, process 1100 may involve processor 1001 bonding the powdered materials to form the one or more 3D objects with a corresponding intensity of energy. Different powdered materials may require different amounts of energy for bonding as melting points or phase transition temperatures may be different. Energy source 1050 of powder bed fusion additive manufacturing system 1000 may have a limit on the output intensity and may not be exceed during concurrent printing. Process 1100 may proceed from 1120 to 1130.

At 1130, process 1100 may involve processor 1001 grouping the one or more 3D objects into one or more groups. Each group may include a subset of the one or more 3D objects having a summation of corresponding minimum intensity of energy less than or equal to the maximum output intensity of energy source 1050. Process 1100 may proceed from 1130 to 1140.

At 1140, process 1100 may involve processor 1001 arranging an order of one or more print jobs of the one or more groups according a result of grouping. Process 1100 may proceed from 1140 to 1150.

At 1150, process 1100 may involve powder bed fusion additive manufacturing system 1000 printing a subset of the one or more 3D objects in each group concurrently according to the order of the one or more print jobs. Process 1100 may further involve processor 1001 controlling powder dispensing unit 1022(1)-1022(N), controlling print head 1010, controlling heights and positions of optical-mechanical assembly 1030(1)-1030(N), and controlling temperatures of build platform 1024(1)-1024(N) as those described in example scenario 400, 550, 600, 700, 800, and 900 during the print job. Process 1100 may proceed from 1150 to 1160.

At 1160, processor 1100 may involve operator(s) of powder bed fusion additive manufacturing system 1000 removing printed 3D objects and remaining powders from build chamber 1020(1)-1020(N) upon completion of a print job to make respective build chambers available. The removal of printed 3D objects and remaining powders may be performed as illustrated in example scenario 500 from a side of the respective build chambers by taking out build platform 530 on rails or wheels.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. An apparatus, comprising:
a print head comprising an energy source, and one or more energy patterning devices configured to provide one or more two-dimensional patterned incident beams to process a powdered material;
an optical-mechanical assembly comprising optical components arranged to receive and direct the one or more incident beams into a location of a top surface of the powdered material; and
a rejected energy handling device configured to reuse beam energy rejected by the one or more energy patterning devices by relaying the rejected beam energy to an electricity generator.

2. The apparatus of claim 1, further comprising:
a build chamber configured to at least partially surround a build platform capable of holding a powder bed formed by the powdered material,
wherein the optical-mechanical assembly is configured to direct the one or more incident beams into the build chamber.

3. The apparatus of claim 2, wherein the build platform is height adjustable.

4. The apparatus of claim 2, wherein the build chamber is configured to accommodate side removal of the build platform.

5. The apparatus of claim 2, wherein the build chamber further comprises a thermal regulation system, wherein the thermal regulation system comprises at least one of a heating source and a cooling component embedded in the build platform and one or more walls forming the build chamber.

6. The apparatus of claim 5, wherein the cooling component comprises a fluid channel embedded inside either or both of a wall and a ceiling of the build chamber and configured to flow a fluid therein, and wherein the fluid comprises oil, water, steam, air, nitrogen, or argon.

7. The apparatus of claim 5, wherein a temperature sensor is embedded in the build platform or the one or more walls forming the build chamber.

8. The apparatus of claim 5, wherein the build chamber further comprise an insulating or low thermal-conductivity material built into the one or more walls.

9. The apparatus of claim 2, wherein the build chamber further comprises a dispensing device to dispense a layer of the powdered material on a top surface of the powder bed inside the build chamber.

10. The apparatus of claim 2, wherein the build platform is set at a fixed height, and wherein the optical-mechanical assembly is moved in a vertical direction to focus and direct one of the one or more incident beams onto a top surface of the powder bed inside the build chamber.

11. The apparatus of claim 2, further comprising:
a processor configured to control the print head, the optical-mechanical assembly, and the build chamber to perform additive manufacturing.

12. The apparatus of claim 11, wherein, in controlling the print head, the processor is configured to control an intensity, a direction, and a duration of the one or more incident beams generated by the energy source during a print process.

13. The apparatus of claim 11, wherein, in controlling the optical-mechanical assembly, the processor is configured to control a beam size and a coordinate of at least one of the one or more incident beams on a top surface of the powder bed inside the build chamber during a print process.

14. The apparatus of claim 11, wherein the build chamber further comprises a thermal regulation system, wherein the thermal regulation system comprises at least one of a heating source and a cooling component embedded in the build platform and one or more walls forming the build chamber, and wherein, in controlling the build chamber, the processor is configured to control a temperature of the build chamber by controlling the thermal regulation system, and to control a distance from a top surface of the powdered bed to the optical-mechanical assembly during a print process.

15. An apparatus, comprising:
a print head comprising an energy source, and one or more energy patterning devices configured to provide one or more two-dimensional patterned incident beams;
an optical-mechanical assembly comprising optical components arranged to receive the one or more two-dimensional patterned incident beams; and
a rejected energy handling device configured to reuse beam energy rejected by the one or more energy patterning devices by relaying the rejected beam energy to an electricity generator.

16. The apparatus of claim 15, further comprising:
a build platform to hold a powder bed formed by a powdered material,
wherein the build platform is height adjustable.

17. The apparatus of claim 16, wherein the optical-mechanical assembly is movable in a vertical direction to focus and direct one of the one or more two-dimensional patterned incident beams onto a top surface of the powder bed held by the build platform.

18. The apparatus of claim 16, wherein the build platform is maintained at a fixed height, and wherein a build chamber is configured to at least partially surround the build platform.

19. The apparatus of claim 16, further comprising:
a build chamber configured to at least partially surround the build platform and
accommodate a side removal of the powder bed.

* * * * *